(12) United States Patent
Sekine et al.

(10) Patent No.: US 9,691,519 B2
(45) Date of Patent: Jun. 27, 2017

(54) INSULATING PASTE, ELECTRONIC DEVICE AND METHOD FOR FORMING INSULATOR

(71) Applicant: NAPRA CO., LTD., Tokyo (JP)

(72) Inventors: Shigenobu Sekine, Tokyo (JP); Yurina Sekine, Tokyo (JP)

(73) Assignee: NAPRA CO., LTD., Tokyo (JP)

(*) Notice: Subject to any disclaimer, the term of this patent is extended or adjusted under 35 U.S.C. 154(b) by 0 days.

(21) Appl. No.: 14/085,377

(22) Filed: Nov. 20, 2013

(65) Prior Publication Data

US 2014/0147578 A1    May 29, 2014

(30) Foreign Application Priority Data

Nov. 26, 2012    (JP) .................. 2012-257828

(51) Int. Cl.
| | |
|---|---|
| *B05D 3/02* | (2006.01) |
| *H01B 3/18* | (2006.01) |
| *H01B 3/46* | (2006.01) |
| *H01B 13/06* | (2006.01) |
| *H01B 3/00* | (2006.01) |
| *H01L 23/48* | (2006.01) |
| *H01L 21/02* | (2006.01) |
| *H01L 21/768* | (2006.01) |

(52) U.S. Cl.
CPC .............. *H01B 3/18* (2013.01); *H01B 3/006* (2013.01); *H01B 3/46* (2013.01); *H01B 13/06* (2013.01); *H01L 21/02123* (2013.01); *H01L 21/02282* (2013.01); *H01L 21/76898* (2013.01); *H01L 23/481* (2013.01); *H01L 21/76831* (2013.01); *H01L 2924/0002* (2013.01)

(58) Field of Classification Search
CPC . H01B 3/18; H01B 13/06; H01B 3/46; H01B 3/008; C08K 3/02; C08K 3/34; H01L 29/00
USPC ........................................... 427/287
See application file for complete search history.

(56) References Cited

U.S. PATENT DOCUMENTS

| | | |
|---|---|---|
| 7,229,672 B2 | 6/2007 | Kim et al. |
| 2004/0007753 A1 | 1/2004 | Seki et al. |
| 2004/0016962 A1 | 1/2004 | Okumura et al. |
| 2005/0159001 A1 | 7/2005 | Kim et al. |
| 2007/0185261 A1* | 8/2007 | Lee et al. ............. 524/588 |

(Continued)

FOREIGN PATENT DOCUMENTS

| | | |
|---|---|---|
| CN | 1644622 A | 7/2005 |
| CN | 101894718 A | 11/2010 |

(Continued)

OTHER PUBLICATIONS

Scamardella et al. "Silicone Resins Filled with Alumina Nanoparticles for Impregnation of Electrical Motors Title" ECCM15—15th European Conference on Composite Materials Jun. 2012.*

(Continued)

*Primary Examiner* — Robert S Walters, Jr.
(74) *Attorney, Agent, or Firm* — Westerman, Hattori, Daniels & Adrian, LLP

(57) ABSTRACT

An insulating paste includes insulating particles 311, Si particles 312 and an organic Si compound 320. The organic Si compound 320 reacts with the Si particles 312 to form a Si—O bond filling up the space around the insulating particles 311.

2 Claims, 8 Drawing Sheets

(56) References Cited

U.S. PATENT DOCUMENTS

2008/0237781 A1   10/2008  Uchiyama
2010/0296842 A1   11/2010  Imura et al.

FOREIGN PATENT DOCUMENTS

| EP | 2144279 A2 | 1/2010 |
|----|-----------|--------|
| JP | 56-106301 A | 8/1981 |
| JP | 2004-31923 A | 1/2004 |
| JP | 2006-302641 A | 11/2006 |
| JP | 2008-251964 A | 10/2008 |
| JP | 2010-132511 A | 6/2010 |
| JP | 2010-153655 A | 7/2010 |
| JP | 2011-184729 A | 9/2011 |
| KR | 10-0190000 B1 | 6/1999 |

OTHER PUBLICATIONS

Database WPI Week 201049, Thomson Scientific, London GB, AN 2010-H91206, XP002723944 (2 pages), in Extended European Search Report dated May 16, 2014.
Extended European Search Report dated May 16, 2014, issued in European Patent Application No. 13275284.1 (7 pages).
Office Action dated Jul. 21, 2014, issued in corresponding Korean Patent Application No. 10-2013-0143839 (5 pages).
Office Action dated Dec. 4, 2014, issued in Chinese Application No. 201310611930.6. (6 pages).

\* cited by examiner (A)

PREPARATION (B)

POURING OF INSULATING PASTE
( PASTE CONTAINS INSULATING PARTICLES ($SiO_2$),
Si PARTICLES AND ORGANIC Si COMPOUND )

(C)

HARDENING

INSULATING PASTE, ELECTRONIC DEVICE AND METHOD FOR FORMING INSULATOR

TECHNICAL FIELD

The present invention relates to an insulating paste, an electronic device and a method for forming an insulator.

BACKGROUND OF THE INVENTION

Recently, there is an increasing need to form a minute insulating region in various types of electronic devices. In a TSV (through-silicon-via) technology, for example, a through-electrode has to be electrically insulated from a silicon substrate. As means for electrical insulation, Japanese Unexamined Patent Application Publication No. 2008-251964 discloses a technology of forming a ring-shaped isolation groove passing through a silicon substrate in such a manner as to surround a through-electrode, forming a silicon film directly on the bottom and the side walls of the isolation groove, then forming an insulating film on the silicon film in such a manner as to fill up a gap left in the isolation groove, and thermally oxidizing each surface of the silicon film in contact with the inner or outer side wall of the isolation groove into a thermal silicon oxide film.

However, it is difficult to form a sufficiently thick insulating film, so that a metallic component of the through-electrode, e.g., Cu may be spread into the silicon oxide film and then into the silicon substrate, impairing the electrical insulation.

On the other hand, Japanese Unexamined Patent Application Publication No. 2004-31923 discloses the details of how an isolation trench groove should be formed for a MOS transistor or a bipolar transistor. Its disclosure is generally as follows.
(a) A suspension in which insulating particles such as silica particles are dispersed in a dispersion medium such as an organic solvent is applied to a trench-having surface of a silicon substrate by spin coating, and then, the dispersion medium is removed from the applied film to fill the trench with the insulating particles. The insulating particles are bonded neither to each other nor to the side walls and the bottom of the trench. Then, therefore, the upper side of the trench is closed by a reflowable dielectric layer, preventing the insulating particles from escaping from the trench.
(b) Also disclosed is a particulate insulating layer in which after the insulating particles are filled in the trench in the same manner as in the above (a), the insulating particles are bonded to each other through an insulating binder to form a network structure of the insulating particles and the insulating binder. It describes that an inorganic or organic SOG obtained by dissolving a silanol in an organic solvent can be used as a material for the insulating binder. Also disclosed is that —OH and —O— bonded to an Si atom in the silanol used for the inorganic or organic SOG can be partially replaced with —H, that —$CH_3$ in the silanol used for the organic SOG can be replaced with other alkyl groups such as —$C_2H_5$, that —OH and —O— bonded to an Si atom in the silanol used for the organic SOG can be partially replaced with alkyl groups such as —$CH_3$ and —$C_2H_5$, and so on.
(c) A first particulate insulating layer containing no binder and a second particulate insulating layer containing a binder are combined into an insulating layer. The top of the first particulate insulating layer containing no binder is covered with the second particulate insulating layer containing an insulating binder.
(d) A particulate insulating layer forming an insulating layer includes first and second insulating particles that are homogeneously mixed together and an insulating binder for cross-linking them.

In Japanese Unexamined Patent Application Publication No. 2004-31923, however, since the insulating particles such as silica particles are bonded neither to each other nor to the side walls and the bottom of the trench, it is required to employ the technique of closing the upper side of the trench with a reflowable dielectric layer (see the above (a)) or the technique of bonding the insulating particles through a binder (see the above (b) to (d)), complicating the insulating structure and the manufacturing process.

In the case of the above technique (a), moreover, it is impossible to form an insulating layer having a high adhesion strength to the silicon substrate. In the case of the technique (b), since the particulate insulating layer has a network structure composed of the insulating particles and the insulating binder, the adhesion strength of the insulating layer to the silicon substrate is not sufficient, either. When using a binder such as an organic SOG, on the other hand, since the insulating layer contains carbon, it is not inherently desirable as an insulating layer that requires high insulation resistance. In the techniques (c) and (d), since the first and second insulating particles are employed, the problem still remains regarding the adhesion strength.

Furthermore, when the binder for bonding the insulating particles together is filled and hardened after the insulating particles are put in the trench, the whole body may shrink to leave a gap between the insulating layer and the substrate.

Meanwhile, Japanese Unexamined Patent Application Publication No. 2010-132511 discloses a technology in which a SIRAGUSITAL-B4373 (heatless glass) silica liquid in which inorganic compound particles of a submicron size are dispersed and filled is coated on an interface between a glass and a glass or a metal or between a metal and a metal or a ceramic and a vitrified networking reaction is allowed to proceed to complete vitrification hardening.

Also in this technology, however, when the insulating particles are hardened in a minute space, the whole body may shrink to leave a gap between the insulating layer and the substrate.

SUMMARY OF THE INVENTION

1. Insulating Paste

An insulating paste according to the present invention comprises insulating particles, Si particles and an organic Si compound. The organic Si compound reacts with the Si particles to form a Si—O bond filling up the space around the insulating particles. The insulating paste according to the present invention can be prepared by dispersing the insulating particles, the Si particles and the organic Si compound in a proper dispersion medium. The term "insulating particles" is interchangeable with the term "dielectric particles" in the sense that they can have a certain relative permittivity.

2. Method for Forming Insulator

In a method for forming an insulator according to the present invention, the insulator should be formed in a minute space. The term "minute space" as used herein refers to a small space left between two adjacent members or a hole or groove formed in a single member.
(1) First Method In a first method, the insulator is formed in the minute space with the insulating paste according to the present invention. In the first method, at first, an insulating paste containing insulating particles, Si particles and an organic Si compound is poured into the minute space.

Subsequently, the organic Si compound is reacted with the Si particles by heat treatment to form a Si—O bond network filling up the space around the insulating particles.

By performing the above process with the insulating paste according to the present invention, an insulator with excellent physical and chemical strength can be formed in the minute space.

Moreover, the Si—O bond filling up the space around metal oxide particles, more specifically, amorphous $SiO_2$ can be formed by reacting the organic Si compound with the Si particles. That is, since the formation of the oxide from the Si particles increases the volume, a highly reliable insulator can be formed in the minute space, which is free from defects such as a gap, a void or a crack. It should be noted that the volume of the $SiO_2$ increases by about 30 to 35% from that of the Si particles. This corresponds to the shrinkage ratio of the Si particles, preventing the formation of a void, a gap or a crack due to the shrinkage.

Furthermore, since the insulating paste according to the present invention contains the insulating particles, the insulator can be provided with various electrical properties based on the properties of the insulating particles. For instance, when the insulating particles comprise a ferroelectric material such as barium titanate, the insulator can be provided with a large capacitance; when the insulating particles comprise a low dielectric material, the insulator can be provided with a small capacitance.

(2) Second Method

In a second method for forming the insulator in the minute space, at first, a silicon oil is poured into the minute space and Si particles are formed by heat treatment.

Then, an insulating paste containing insulating particles and an organic Si compound is poured into the minute space, and subsequently, the organic Si compound is reacted with the Si particles by heat treatment to form a Si—O bond network filling up the space around the insulating particles.

The second method is different from the first method in that the silicon oil in the minute space is subjected to heat treatment to form the Si particles.

3. Electronic Device

An electronic device according to the present invention can be formed by the foregoing insulator forming method with the foregoing insulating paste. For example, a small insulator may be formed for a conductor or a semiconductor, or an underfill for filling up a minute gap left between stacked substrates may be formed in a multilayered electronic device.

The other objects, constructions and advantages of the present invention will be further detailed below with reference to the attached drawings. However, the attached drawings show only illustrative examples.

DESCRIPTION OF THE PREFERRED EMBODIMENTS

1. Insulating Paste

Figure 1:
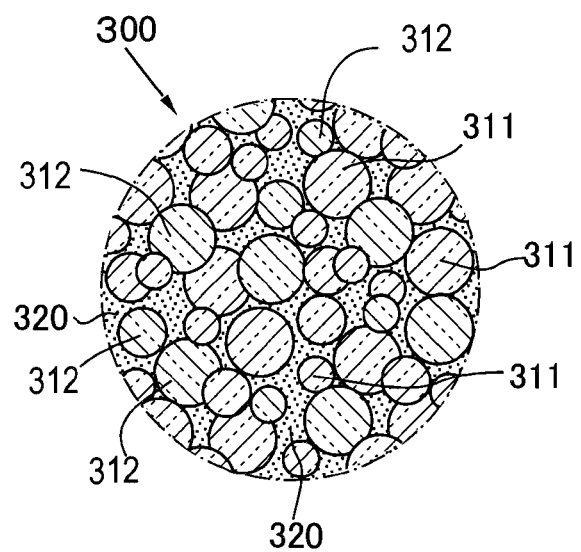
FIG. 1 is a drawing schematically showing the composition of an insulating paste according to the present invention.

Referring to FIG. 1, an insulating paste 300 according to the present invention contains insulating particles 311, Si particles 312 and a liquid organic Si compound 320. When reacted with the Si particles 312, the organic Si compound 320 forms a Si—O bond around the insulating particles 311 (which serve as an aggregate), thus serving to fill up the space around the insulating particles 311.

The insulating particles 311 and the Si particles 312 have a particle size of nanometer order (equal to or less than 1 μm). Although the insulating particles 311 and the Si particles 312 are depicted as being spherical in FIG. 1, they may have any shape and should not be construed as limited to the spherical shape. Moreover, the insulating particles 311 and the Si particles 312 are not required to have a uniform particle size but may have various particle sizes within the nanometer range.

2. Method for Forming Insulator (1) First Method

Figure 2:
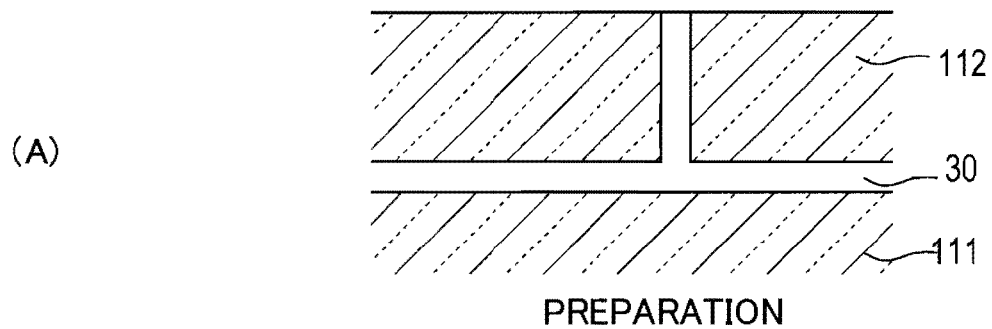
FIG. 2 is a drawing showing a method for forming an insulator in a minute space according to the present invention.
Figure 2:
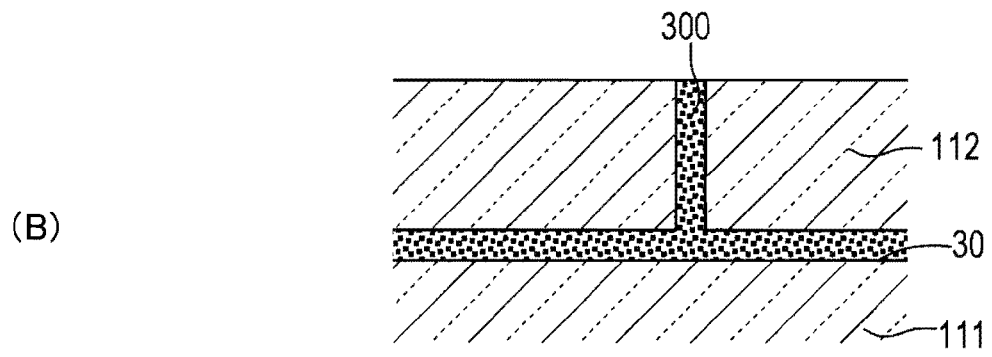
Figure 2:
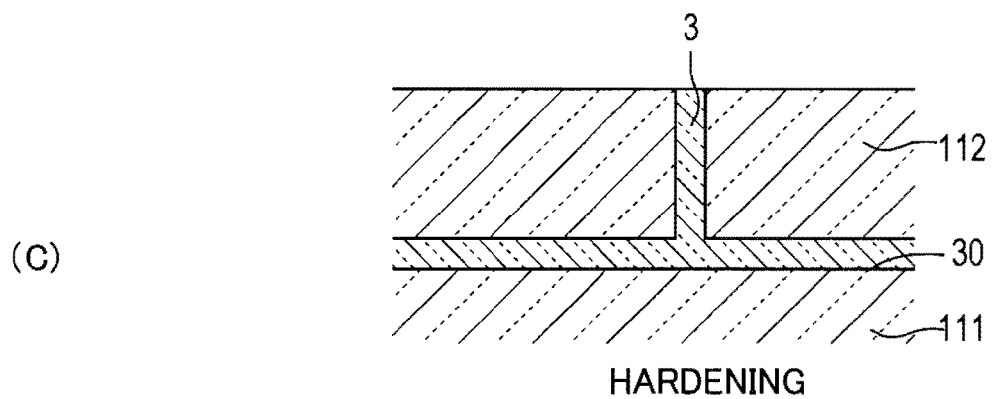

In a first method for forming an insulator in a minute space with the insulating paste 300 according to the present invention, at first, members 111, 112 having a minute space 30 are prepared as shown in FIG. 2(A). The members 111, 112 may be different members or may constitute a single member. It is also preferable that at least the surfaces defining the minute space 30 possess electrical conductivity. The minute space 30 may take various forms such as a vertical hole, a transverse hole, a strip-shaped groove or a gap left between different members.

Then, as shown in FIG. 2(B), the insulating paste 300 shown in FIG. 1 is poured into the minute space 30. As described above, the insulating paste 300 contains the insulating particles 311, the Si particles 312 and the organic Si compound 320. It is also possible to pour the liquid organic Si compound 320 after the insulating particles 311 and the Si particles 312 are put in the minute space.

Then, as shown in FIG. 2(C), the organic Si compound 320 is reacted with the Si particles 312 to form the Si—O bond network filling up the space around the insulating particles 311. Preferably, the reaction between the organic Si compound 320 and the Si particles 312 is allowed to proceed under vacuum while being heated, for example, within a temperature range of 130° C. to 150° C. Thus, the insulator 3 can be formed as shown in FIG. 2(C). Organic substances resulting from the reaction can be thermally decomposed and discharged as a gas.

Figure 3:
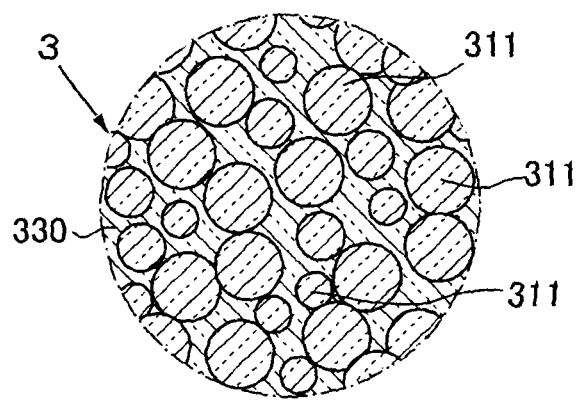
FIG. 3 is a drawing schematically showing the structure of an insulator that is formed with an insulating paste according to the present invention.

The insulator 3 has a structure shown in FIG. 3 in which the space around the insulating particles 311 is completely filled up with the Si—O bond network, more specifically, amorphous silica ($SiO_2$) 330.

More preferably, heating is performed such that the substances in the hole or groove (minute space) are heated under pressure and then cooled under pressure. This process further accelerates the thermal decomposition of the organic substances and also increases the density of the insulating layer, improving the adhesion to the semiconductor substrate.

By performing the above process with the insulating paste 300 according to the present invention, the insulator 3 with excellent physical and chemical strength can be formed in the minute space.

Moreover, the Si—O bond filling up the space around the insulating particles 311, more specifically, the amorphous silica (SiO$_2$) 330 can be formed by reacting the organic Si compound 320 with the Si particles 312. That is, since the formation of the oxide from the Si particles increases the volume, a highly reliable insulator can be formed in the minute space, which is free from defects such as a gap, a void or a crack and has a high adhesion strength to the side wall of the minute space. It should be noted that the volume of the SiO$_2$ increases by about 30 to 35% from that of the Si particles 312. This corresponds to the shrinkage ratio of the Si particles 312, preventing the formation of a void, a gap or a crack due to the shrinkage.

Furthermore, since the insulating paste 300 according to the present invention contains the insulating particles 311, the insulator can be provided with various electrical properties based on the properties of the insulating particles 311. Basically, the insulating particles 311 are metal oxide particles (ceramic). For instance, when the insulating particles 311 comprise a ferroelectric material such as barium titanate, the insulator can be provided with a large capacitance; when the insulating particles 311 comprise a low dielectric material such as SiO$_2$ or Al$_2$O$_3$, the insulator can be provided with a small capacitance.

A typical example of the organic Si compound 320 to be used in the present invention is alkylalkoxysilane represented by the formula:

$$CH_3—[Si_nO_{n-1}(CH_3)_n(OCH_3)_n]—CH_3.$$

In this case, the reaction formula is as follows.

$$Si+CH_3O—[Si_nO_{n-1}(CH_3)_n(OCH_3)_n]—CH_3 \rightarrow SiO_2+(C,H,O)\uparrow \quad (1)$$

When the substrate having the minute space is a Si substrate, the above reaction also occurs with Si of the Si substrate. Alternatively, it is also possible to use organopolysiloxane (alkoxysilane having a functional side chain). For instance, it is Si or disiloxane having an alkoxy group (RO), where R is an organic group.

(2) Second Method

A second method relates to formation of Si. At first, as shown in FIG. 4(A), a silicon oil 301 is poured into the minute space 30 formed in the members 111, 112 and subjected to heat treatment to form Si particles 302, as shown in FIG. 4(B). Then, the foregoing reaction (1) is carried out as shown in FIGS. 4(C) and 4(D).

As the silicon oil 301, dimethypolylsiloxane (C$_2$H$_6$OSi)n may be used. In this case, since heating should be performed first under an inert gas atmosphere and then under vacuum, the heat treatment condition and the reaction formula vary as follows.

(a) When heating is performed under an inert gas atmosphere, the following reaction is allowed to proceed within a temperature range of 150° C. to 300° C.

$$SiCH_3+O_2 \rightarrow SiCH_2+HO_2$$

$$SiCH_3+HO_2 \rightarrow SiCH_2+2HO$$

$$2SiCH_3+2HO \rightarrow 2(SiCH_2)+2H_2O$$

$$SiCH_2+O_2 \rightarrow SiCH_2O_2 \rightarrow SiO+CH_2O$$

Since atmospheric heating results in producing SiO$_2$, heating should be performed under an inert gas atmosphere so as to produce Si. The heating time is five hours or so.

$$SiCH_2O_2+SiCH_3 \rightarrow SiCH_2O_2H+SiCH_2$$

$$SiCH_2O_2H \rightarrow SiCH_2O+HO$$

(b) After heating for five hours, the following reaction is allowed to proceed by heating under vacuum within a temperature range of 450° C. to 500° C.

$$SiCH_2O \rightarrow Si+CH_2O$$

Through the above reaction, Si nanoparticles can be produced. When the insulating particles comprise SiO$_2$ and when the substrate is a Si substrate, the Si nanoparticles can adhere to their surface.

(c) Then, as the organic Si compound, alkylalkoxysilane represented by the formula: CH$_3$O—[Si$_n$O$_{n-1}$(CH$_3$)$_n$(OCH$_3$)$_n$]—CH$_3$ is infiltrated into the minute space along with the insulating particles.

(d) Then, the reaction is allowed to proceed by atmospheric heating within a temperature range of 450° C. to 500° C. This reaction occurs as represented by the foregoing reaction formula (1).

$$Si+CH_3O—[Si_nO_{n-1}(CH_3)_n(OCH_3)_n]—CH_3 \rightarrow SiO_2+(C,H,O)\uparrow \quad (1)$$

In the process of the above reaction, when the substrate having the minute space is a Si substrate, the above reaction also occurs with Si of the Si substrate. Alternatively, as described above, it is also possible to use organopolysiloxane (alkoxysilane having a functional side chain). For instance, it is Si or disiloxane having an alkoxy group (RO), where R is an organic group. Thus, a strong bonding layer of SiO$_2$ (Si—O bond network) can be formed between the silica particles and the Si substrate.

3. Electronic Device

The present invention is applicable to various types of electronic devices in which a small insulator should be formed for a conductor or a conductive substrate of a semiconductor or the like. In various types of electronic devices based on the TSV technology, for example, vertical conductors formed in a semiconductor substrate can be electrically insulated from other vertical conductors and semiconductor circuit elements formed in the semiconductor substrate. Its concrete example will be described hereinbelow.

Figure 5:
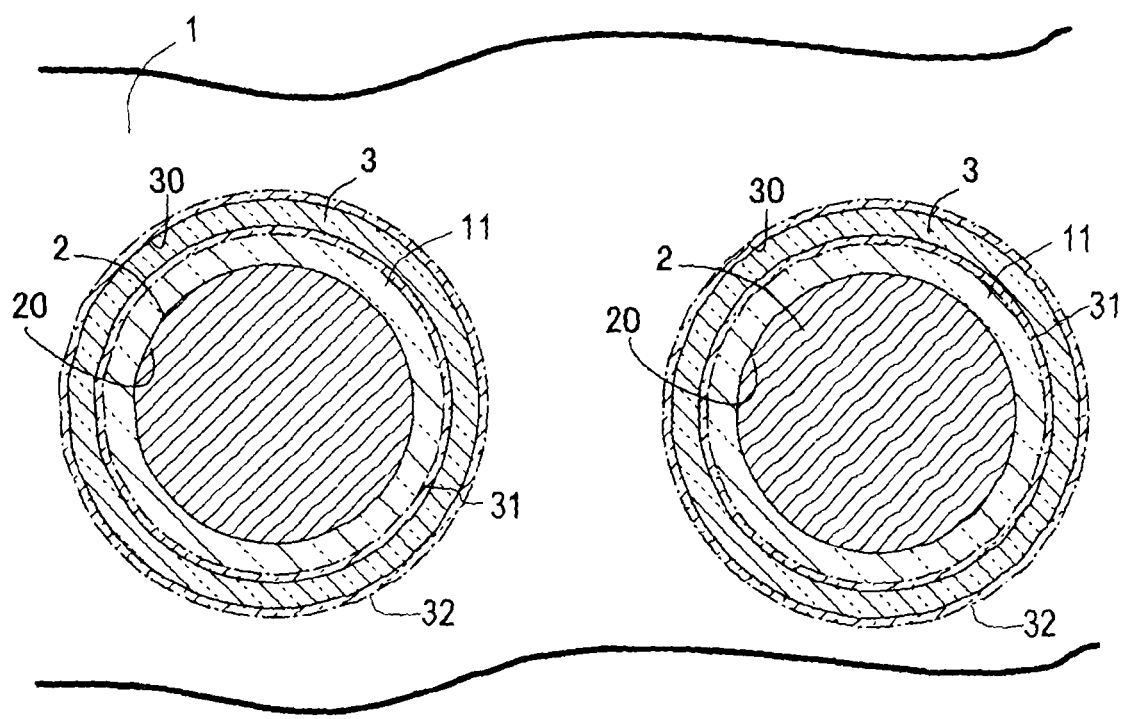
FIG. 5 is a plan view showing a part of an electronic device according to the present invention.
Figure 6:
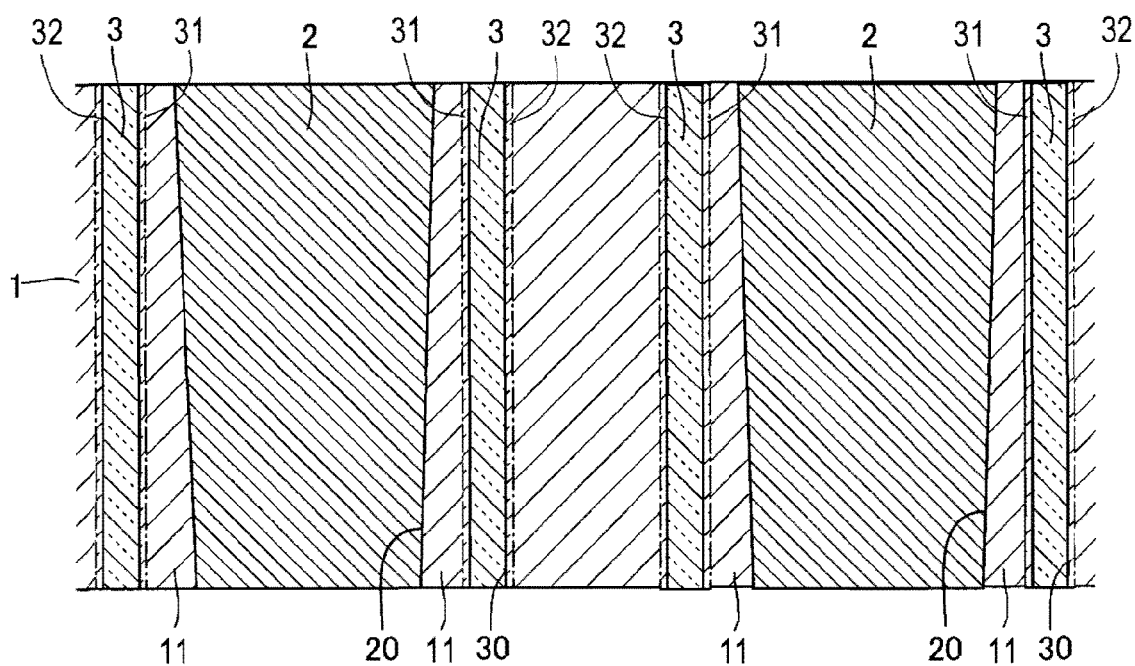
FIG. 6 is a sectional view of the electronic device shown in FIG. 5.

Referring first to FIGS. 5 and 6, a semiconductor substrate 1 has an insulating layer 3 extending along its thickness direction. The insulating layer 3 is filled in a hole or groove (hereinafter referred to as via) 30 extending along the thickness direction of, for example, a silicon substrate constituting the semiconductor substrate 1. The groove may take any shape such as a straight line shape, a curved line shape or a ring shape. In the case of the hole, its opening may take any shape such as a circular shape, a square shape or an oval shape.

The insulating layer 3 is formed with the insulating paste 300 shown in FIG. 1 and composed of the nm-sized insulating particles 311 and the amorphous silica 330 filling up the space between the insulating particles 311.

While the insulating particles 311 exist in the form of particles, the silica 330 is amorphous and indefinite in shape. Accordingly, even though their elements are almost identical SiO$_2$, the insulating particles 311 and the silica 330 can be distinguished from each other.

In principle, it is preferred that the insulating particles 311 has a particle size equal to or less than one-tenth of the groove width of the via 30. When the hole diameter or groove width of the via 30 is set equal to or less than 10 μm, for example, a few μm, the particle size of the insulating particle 311 is equal to or less than 1 μm, for example, about a few hundred nm.

In the semiconductor substrate 1 according to the present invention, since the insulating layer 3 is composed of the nm-sized insulating particles 311 and the silica 330 filling up the space between the insulating particles 311, as described above, there can be obtained a highly reliable insulating layer 3 free from defects such as a crack or a void.

More specifically, if the insulating layer 3 is composed only of the insulating particles 311, small voids or hollows may be formed between the insulating particles 311 to cause cracking of the insulating layer 3, and such cracks may extend to the semiconductor substrate 1, e.g., the silicon substrate, damaging the silicon substrate and semiconductor circuit elements formed therein.

In the present invention, on the other hand, the insulating layer 3 is composed of the insulating particles 311 and the silica 330 filling up the space around the silica particles 311, so that small voids or hollows between the insulating particles 311 can be filled up with the silica 330. This prevents cracking of the insulating layer 3, avoiding that the silicon substrate and the semiconductor circuit elements formed therein are damaged by cracking or the like.

When the nanocomposite structure is composed of the nm-sized insulating particles 311 and the silica 330 tightly filling up the space around the insulating particles 311, moreover, stress can be reduced as a specific effect of the nanocomposite structure, so that the distance between the semiconductor circuit elements and the insulating layer 3 can be shortened to improve area efficiency for formation of the semiconductor circuit elements.

The insulating layer 3 is ring-shaped and provided in a ring-shaped groove 30 that is formed in the semiconductor substrate 1 to surround the vertical conductor 2. With the insulating layer 3, accordingly, the semiconductor substrate 1 is divided into an inner ring-shaped portion 11 and an outer portion. Thus, the vertical conductor 2 is electrically insulated from the semiconductor substrate 1 and the other vertical conductors 2.

The ring-shaped groove 30 can be formed by a known technology such as a CVD process or a laser drilling process. The ring-shaped groove 30 extends along the thickness direction of the semiconductor substrate 1 and has an first inner diameter that is larger than a outer diameter of a vertical hole 20 accommodating the vertical conductor 2. Between the inner wall surface of the vertical hole 20 and the inner wall surface of the ring-shaped groove 30, accordingly, the semiconductor substrate 1 is left like an island by a diameter difference, providing the ring-shaped portion 11. The ring-shaped groove 30 has an second inner diameter that is larger than the first inner diameter by a groove width. The groove width of the ring-shaped groove 30 may be, but not limited to, equal to or less than 10 μm, for example, a few μm.

The insulating layer 3 may further include insulating films 31, 32. The insulating films 31, 32 preferably include an oxide film, more preferably a nitride film. The oxide film and the nitride film may be a single layer, multiple layers or a combination thereof. In addition, the oxide film and the nitride film may be deposited on the wall surface of the ring-shaped groove 30 or obtained by oxidizing or nitriding the surface of the semiconductor substrate 1 which appears on the wall surface of the ring-shaped groove 30. With this insulating structure, a negative effect of the insulating layer 3 on the semiconductor substrate 1 can be blocked by the insulating films 31, 32.

In the illustrated embodiment, the insulating films 31, 32 are obtained by oxidizing or nitriding the inner wall surfaces of the ring-shaped groove 30. That is, the wall surfaces of the ring-shaped groove 30 are covered with the insulating films 31, 32, and the insulating layer 3 is filled in the ring-shaped groove 30 covered with the insulating films 31, 32.

If the semiconductor substrate 1 is a common silicon substrate, for example, the oxide film is a silicon oxide film and the nitride film is a silicon nitride film. The silicon oxide film and the silicon nitride film may be formed by applying a known technology. For example, there have been known a process of oxidizing or nitriding the surface of the silicon substrate and a process of depositing the insulating layer 3 using a chemical vapor deposition process (CVD process), and either process may be employed. The oxidizing or nitriding depth of the insulating films 31, 32, i.e., substantial layer thickness is preferably determined in view of actually required transmission characteristics.

The insulating layer 3 may be a single layer or may have a plurality of coaxially arranged, spaced layers. In addition, its shape is not limited to the illustrated circular shape but may be a polygonal shape such as a rectangular shape. Moreover, the vertical conductor 2 is not limited to the illustrated circular or cylindrical shape, either. It may have a prismatic shape.

The vertical conductor 2 is filled in the vertical hole 20 extending along the thickness direction of the semiconductor substrate 1. Such vertical conductors 2 can be formed by applying a known technology such as a plating process, a molten metal filling process or a conductive paste filling process. The vertical conductors 2 are distributed in rows in a substrate surface. In the illustrated embodiment, the vertical conductor 2 is a through-electrode passing through the semiconductor substrate 1.

The vertical conductors 2 are arranged at a given arrangement pitch as seen in a plane taken along the substrate surface. For example, the dimensions regarding the vertical conductors 2 are such that the arrangement pitch is in the range of 4 to 100 μm and the maximum diameter is in the range of 0.5 to 25 μm. However, the arrangement pitch is not required to be a certain size, while the diameter is not limited to the above value, either.

Figure 7:
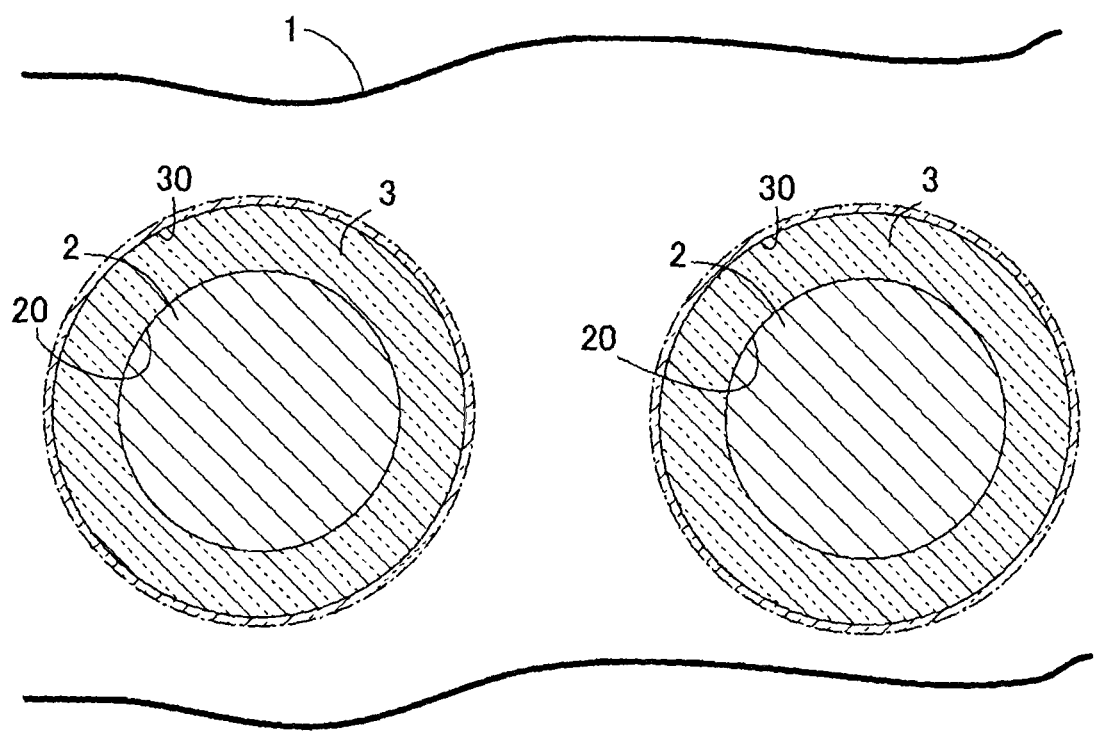
FIG. 7 is a plan view showing another embodiment of an electronic device according to the present invention.
Figure 8:
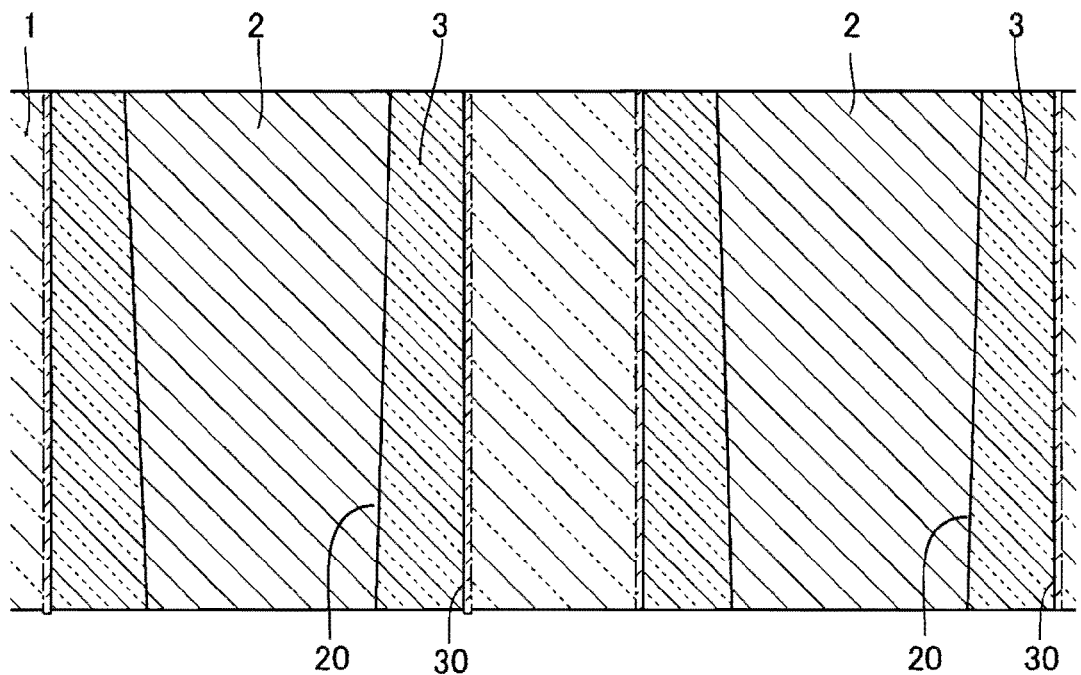
FIG. 8 is a sectional view of the electronic device shown in FIG. 7.

FIGS. 7 and 8 illustrate still another embodiment. In this embodiment, the insulating layer 3 fills up a first hole 30 extending along the thickness direction of the semiconductor substrate 1, and the vertical conductor 2 fills up a second hole 20 that is formed in the insulating layer 3. Also in this embodiment, as shown in FIG. 3 under magnification, the insulating layer 3 is composed of the insulating particles 311 and the silica 330 filling up the space around the insulating particles 311, so that the vertical conductor 2 is electrically insulated from the semiconductor substrate 1 and the other vertical conductors 2.

Figure 4:
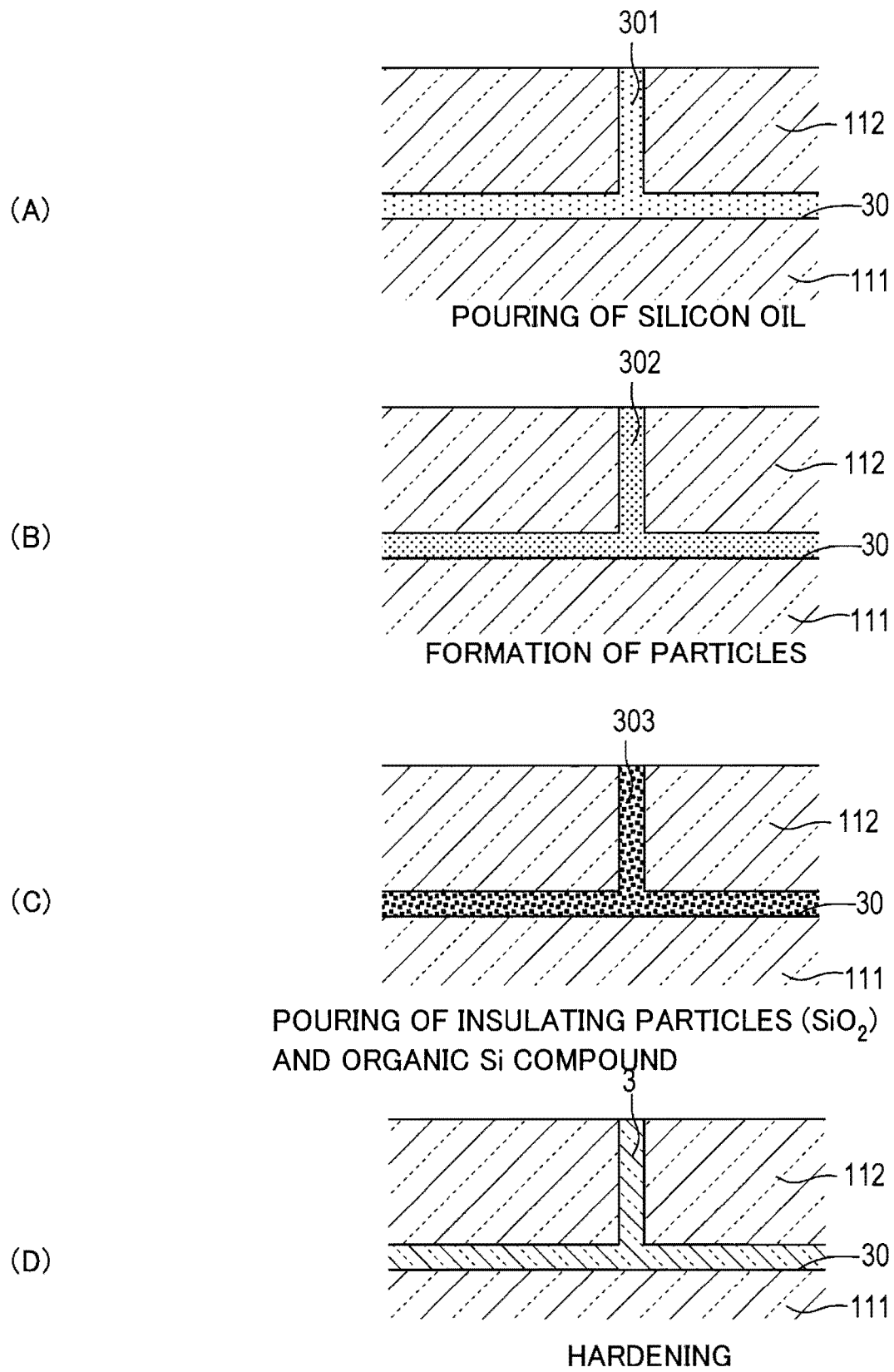
FIG. 4 is a drawing showing another example of a method for forming an insulator in a minute space according to the present invention.

Also in the electronic device shown in FIGS. 7 and 8, since the insulating layer 3 is composed of the insulating particles 311 and the silica 330 filling up the space around the silica particles 311, there can be obtained the effects described with reference to FIGS. 4 and 5.

Since the nanocomposite structure comprising a combination of the nm-sized insulating particles 311 and the silica 330 filling up the space around the silica particles 311 serves to relax the stress occurring in the vicinity of a through-electrode, the distance between the vertical conductor 2 forming the through-electrode and semiconductor circuit elements can be shortened to improve area efficiency for formation of the semiconductor circuit elements.

In addition, since the insulating layer 3 insulates the vertical conductor 2 extending along the thickness direction of the semiconductor substrate 1 from the semiconductor substrate 1, the semiconductor substrate 1 and the vertical conductor 2, e.g., the through-electrode can be electrically insulated with the insulating layer 3 from the other vertical conductors 2 and the semiconductor circuit elements formed in the semiconductor substrate 1.

Moreover, the insulating layer 3 can be formed by filling an insulating material into a ring-shaped groove or a hole extending along the thickness direction of the semiconductor substrate 1. The insulating layer 3 thus formed does not cost much and has a sufficient thickness commensurate with the diameter of the ring-shaped groove or the hole 30.

Typically, such an electronic device can take the form of a three-dimensional system-in-package (3D-SiP). Specifically, it may be a system LSI, a memory LSI, an image sensor, a MEMS or the like. It may also be an electronic device including an analog or digital circuit, a memory circuit such as DRAM, a logic circuit such as CPU or the like or an electronic device that is obtained by preparing different types of circuits such as an analog high frequency circuit and a low frequency, low power consumption circuit in different processes and stacking them.

More specifically, it includes most of electronic devices having an electronic circuit as a functional element, such as a sensor module, an optoelectronic module, a unipolar transistor, a MOS FET, a CMOS FET, a memory cell, integrated circuits (IC) thereof, or various scales of LSIs. In the present invention, integrated circuits called "LSI" include all types of integrated circuits such as a small-scale integration, a medium-scale integration, a large-scale integration, a very-large-scale integration (VLSI), an ultra-large-scale integration (ULSI), and so on.

Even if the foregoing various types of electronic devices are different from the one disclosed in this specification regarding the stacking structure of substrates, the type of the semiconductor substrate 1, the shape, arrangement and hole diameter of the vertical conductors 2 passing through the semiconductor substrate 1 or the like, they can be included in the present invention as long as satisfying the present invention regarding the structure of the insulating layer 3 and the relationship of the insulating layer 3 to the vertical conductor 2.

The present invention has been described in detail above with reference to preferred embodiments. However, obviously those skilled in the art could easily devise various modifications of the invention based on the technical concepts underlying the invention and teachings disclosed herein.

What is claimed is:

1. A method for forming an electrical insulator in a space of an electronic device, comprising the steps of:
    pouring a paste containing electrically insulating particles, Si particles having a particle size equal to or less than 1 μm, and an organic Si compound selected from the group consisting of alkylalkoxysilane and organopolysiloxane into the space; and
    then, reacting the organic Si compound with the Si particles by heat treatment at a temperature of 130° C. to 150° C. under vacuum to form an amorphous silica that completely fills up a space around the electrically insulating particles in the space of the electronic device.

2. A method for forming an electrical insulator in a space of an electronic device, comprising the steps of:
    pouring a silicon oil into the space and forming Si particles by heat treatment;
    pouring a paste containing electrically insulating particles and an organic Si compound selected from the group consisting of alkylalkoxysilane and organopolysiloxane into the space; and
    then, reacting the organic Si compound with the Si particles by a first heat treatment at a temperature of 150° C. to 300° C. in an inert gas atmosphere, followed by a second heat treatment at a temperature of 450° C. to 500° C. under vacuum, followed by a third heat treatment at a temperature of 450° C. to 500° C. in an atmosphere, thereby forming an amorphous silica that completely fills up a space around the electrically insulating particles in the space of the electronic device.

* * * * *